(12) United States Patent
Yousefi et al.

(10) Patent No.: US 12,140,168 B2
(45) Date of Patent: Nov. 12, 2024

(54) FLAT HEAD UNITS FOR HEAVY LOAD ALIGNMENT

(71) Applicant: Applied Materials, Inc., Santa Clara, CA (US)

(72) Inventors: Hassan Yousefi, Santa Clara, CA (US); Ganesh Babu Chandrasekaran, Santa Clara, CA (US); Robin L. Tiner, Santa Cruz, CA (US); Jianhua Zhou, Campbell, CA (US); Isami Iguchi, Tokyo (JP)

(73) Assignee: Applied Materials, Inc., Santa Clara, CA (US)

( * ) Notice: Subject to any disclaimer, the term of this patent is extended or adjusted under 35 U.S.C. 154(b) by 883 days.

(21) Appl. No.: 17/229,998

(22) Filed: Apr. 14, 2021

(65) Prior Publication Data

US 2022/0228616 A1 Jul. 21, 2022

Related U.S. Application Data

(60) Provisional application No. 63/139,858, filed on Jan. 21, 2021.

(51) Int. Cl.
*B23Q 3/18* (2006.01)
*F16B 19/02* (2006.01)

(52) U.S. Cl.
CPC ............... *F16B 19/02* (2013.01); *B23Q 3/18* (2013.01); *B23Q 3/183* (2013.01)

(58) Field of Classification Search
CPC ........... B23Q 3/186; B23Q 3/183; B23Q 7/08
See application file for complete search history.

(56) References Cited

U.S. PATENT DOCUMENTS

| | | | |
|---|---|---|---|
| 2006/0258030 A1* | 11/2006 | Koeda | C23C 14/042 118/715 |
| 2012/0006237 A1* | 1/2012 | Iguchi | F16C 29/046 384/15 |
| 2018/0258966 A1* | 9/2018 | Wu | F16B 5/0266 |

FOREIGN PATENT DOCUMENTS

| | | |
|---|---|---|
| JP | 2004114237 A | 4/2004 |
| JP | 2004150470 A | 5/2004 |

(Continued)

OTHER PUBLICATIONS

English translation of JP2004114237.*
English translation of JP2004150470.*
English translation of JP2005109443.*

*Primary Examiner* — Charles Capozzi
(74) *Attorney, Agent, or Firm* — Lowenstein Sandler LLP

(57) ABSTRACT

A mask frame support unit includes a case, a protruding body extending below the case, and a station having a flat head disposed above the case. The protruding body includes a tapered region and a cylindrical region. The tapered region includes a first end having a first diameter coupled to the case and comprising a second end having a second diameter opposite the first end. The second diameter is less than the first diameter, and the tapered region is coupled to the cylindrical region at the second end. The case houses a number of components including an upper receiving plate in contact with the station, a lower receiving plate disposed underneath the upper receiving plate, a flat head unit movement support mechanism disposed between the lower receiving plate and the body, and a centering component.

20 Claims, 10 Drawing Sheets

(56) References Cited

FOREIGN PATENT DOCUMENTS

| | | |
|---|---|---|
| JP | 2005109443 A | 4/2005 |
| JP | 2010247936 A | 11/2010 |

\* cited by examiner

FLAT HEAD UNITS FOR HEAVY LOAD ALIGNMENT

RELATED APPLICATION

This application claims the benefit of U.S. Provisional Application No. 63/139,858, filed Jan. 21, 2021, the entire contents of which are hereby incorporated by reference herein.

TECHNICAL FIELD

The instant specification generally relates to electronic device fabrication. More specifically, the instant specification relates to flat head units for heavy load alignment.

BACKGROUND

An electronic device manufacturing apparatus can include multiple chambers, such as process chambers and load lock chambers. Such an electronic device manufacturing apparatus can employ a robot apparatus in the transfer chamber that is configured to transport substrates between the multiple chambers. In some instances, multiple substrates are transferred together.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In accordance with an embodiment, a mask frame support unit is provided. The mask frame support unit includes a case, a protruding body extending below the case, and a station having a flat head disposed above the case. The protruding body includes a tapered region and a cylindrical region. The tapered region includes a first end having a first diameter coupled to the case and comprising a second end having a second diameter opposite the first end. The second diameter is less than the first diameter, and the tapered region is coupled to the cylindrical region at the second end. The case houses a number of components including an upper receiving plate in contact with the station, a lower receiving plate disposed underneath the upper receiving plate, a flat head unit movement support mechanism disposed between the lower receiving plate and the body, and a centering component.

In accordance with another embodiment, an apparatus is provided. The apparatus includes a mask frame, an alignment shaft including a hollow cylinder having an opening, and a plurality of mask frame support units including a flat head unit. The flat head unit includes a case, a protruding body extending below the case and integrated into the alignment shaft via the opening, and a station having a flat head disposed above the case. The case houses a plurality of components including an upper receiving plate in contact with the station, a lower receiving plate disposed underneath the upper receiving plate, a flat head unit movement support mechanism disposed between the lower receiving plate and the body, and a centering component.

In accordance with yet another embodiment, a method of forming a mask frame support unit is provided. The method includes inserting an upper receiving plate and a lower receiving plate within a case, forming a centering component within the case, securing a protruding body to a bottom of the case, and securing a station having a flat head to a top of the case. The protruding body includes a tapered region and a cylindrical region. The tapered region includes a first end having a first diameter coupled to the case and comprising a second end having a second diameter opposite the first end. The second diameter is less than the first diameter, and the tapered region is coupled to the cylindrical region at the second end.

BRIEF DESCRIPTION OF THE DRAWINGS

Aspects and implementations of the present disclosure will be understood more fully from the detailed description given below and from the accompanying drawings, which are intended to illustrate aspects and implementations by way of example and not limitation.

DETAILED DESCRIPTION

Figure 1:
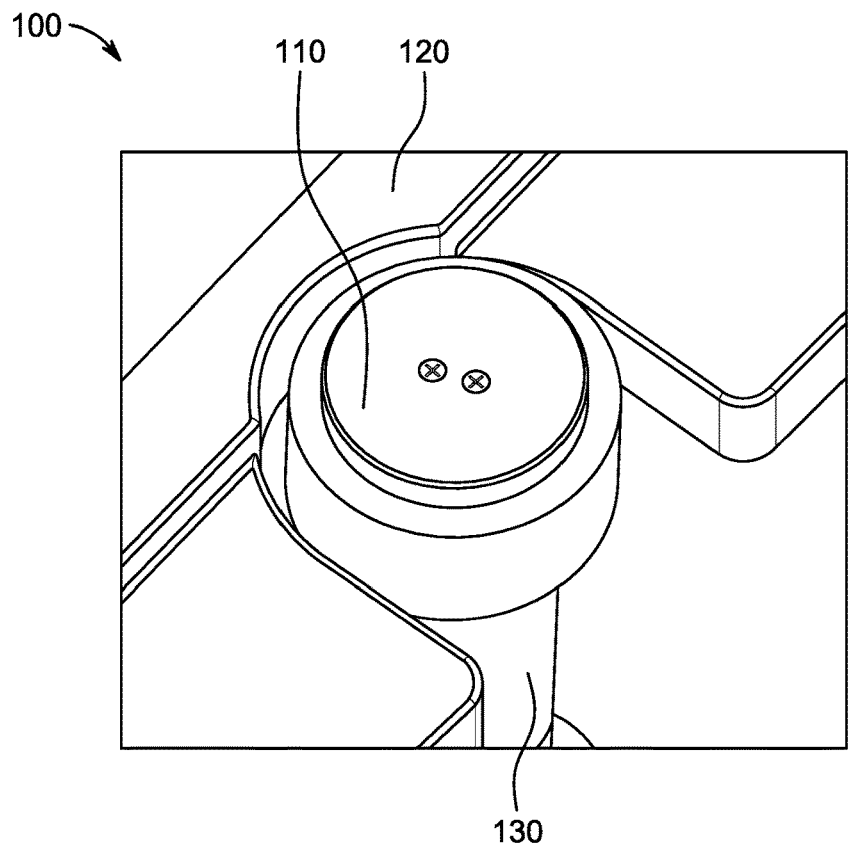
FIG. 1 is a perspective view of an apparatus including a flat head unit, in accordance with some embodiments.

Electronic device processing systems can include vision alignment technology, which can enable manufacturers to reduce production costs by reducing or eliminating photolithography and/or etch processing systems. For example, a conventional vision system can include a number of ball transfer units (BTUs) placed on the top of vision shafts to provide mask support during a vision alignment process. More specifically, each BTU includes a ball (e.g., a ceramic ball within a housing) on which a mask frame can sit to support the weight of the mask frame while still allowing for some movement of the mask frame. However, the small point of contact, or contact surface area, between the mask frame and the balls of the BTUs can result in the formation of undesirable deformations (e.g., dents) or markings (e.g., scratches) in the mask frame due to the concentrated pressure at the points of contact, particularly if the mask frame placed on the BTUs is sufficiently heavy.

Aspects and implementations of the present disclosure address these and other shortcomings of existing technologies by providing flat head units to provide (heavy) load alignment. For example, the flat head units described herein can be used provide load alignment while reducing or eliminating the occurrence of deformations (e.g., dents) or markings (e.g., scratches) on the load. More specifically, the flat head units described herein can provide a larger point of contact, or increased contact surface area, with the load, such as a mask frame, to enable the reduced or eliminated deformations (e.g., local deformations). The flat head units described herein can further support free range of motion of the load in the X-Y plane. For example, the flat head units described herein can be designed to move, e.g., about 7.5 millimeters (mm) from the center in any X-Y direction. To achieve such motion, the flat head units described herein can include flat head movement support mechanisms for supporting the load and enabling movement of the units. For example, the flat head units described herein can be embodied as flat head ball (FHB) units that include a set of balls disposed in a ball retainer. The flat head units described herein can further include a centering component or centering mechanism that can bring the flat head units back to the center when there is no load thereon. For example, the centering component can include a set of tension springs.

For the sake of simplicity and illustration, the embodiments described herein will reference embodiments in which a flat head unit is embodied having a circular surface. However, the surfaces of the flat head units described herein can have any suitable geometry to provide load alignment in accordance with the embodiments described herein. Examples of other suitable geometries for the surfaces of the flat head units include oval shape, polygonal shape (e.g., quadrilateral, hexagonal, octagonal), etc.

In some embodiments, a flat head unit can be implemented as a mask frame support unit within an apparatus including a mask frame. In such embodiments, the flat head unit can support the weight of a mask sheet placed thereon, thereby reducing or eliminating the occurrence of mask deformations (e.g., dents). For example, a number of flat head units can be utilized within a vision system, with each flat head unit being associated with a corresponding shaft (e.g., an idle vision shaft). Illustratively, the flat head units described herein can be implemented within electronic device processing systems including a thin-film encapsulation (TFE) system. A TFE system can be used form thin-film barriers during electronic device processing (e.g., organic light emitting diode (OLED) devices). For example, a TFE system can be used to enable the formation of flexible organic light emitting diode (OLED) devices having a thin-film barrier as a substrate material (as opposed to other materials such as glass), which can reduce cost and enable a lighter and thinner OLED display. A TFE system can be, e.g., a TFE chemical vapor deposition (CVD) (TFE CVD) system (e.g., a TFE plasma-enhanced CVD (TFE PECVD) system).

Aspects and implementations of the present disclosure result in technological advantages over other approaches. For example, as mentioned above, the flat head units described herein can prevent deformation and markings, and can reduce or eliminate the contact stress problem that may be present with BTUs and other similar units. Moreover, the flat head units described herein can enable mask frame movement that may be needed during mask frame alignment. The life cycle of the flat head units described herein can be greater than other units, e.g., BTUs with the same load and test conditions. For example, the flat head units described herein can be designed for a load of, e.g., about 100 kilograms (kg) at a temperature of, e.g., about 80° C. Accordingly, the flat head units described herein, when implemented as mask frame support units, can provide improved mask frame and/or vision alignment accuracy as compared to other units, e.g., BTUs.

FIG. 1 is a perspective view of an apparatus 100, in accordance with some embodiments. In some embodiments, the apparatus 100 is included within a vision system of a thin-film encapsulation (TFE) system. Such embodiments should not be considered limiting, however, and the apparatus 100 can be implemented within any suitable system in accordance with the embodiments described herein.

As shown, the apparatus 100 includes a flat head unit ("unit") 110, a susceptor body 120 and an alignment shaft 130. More specifically, as will be described in further detail herein, the unit 110 can be integrated into, or mated with, the alignment shaft 130 via an opening of the alignment shaft 130. Any suitable mechanism can be used to integrate the unit 100 into the alignment shaft 130 in accordance with the embodiments described herein.

As will be described in further detail below with respect to FIG. 2, the unit 110 can provide support for a mask frame. That is, the unit 110 can be implemented as a mask frame support unit. For example, the unit 110 can be a TFE mask frame support unit. As will be described in further detail herein below, the unit 110 has a geometry designed to support the weight of a mask including the mask frame and a mask sheet in a manner that can reduce contact stress and thus reduce or eliminate mask deformation. For example, in this illustrative embodiment, the unit 110 has a circular surface. Further details regarding the unit 110 will now be described below with reference to FIG. 2.

Figure 2:
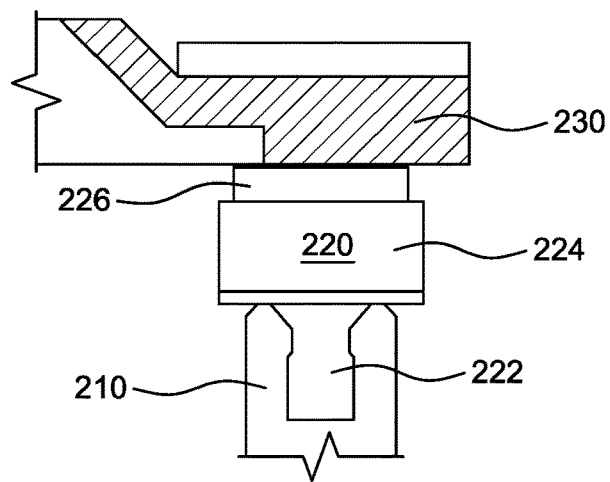
FIG. 2 is a cross-sectional view of an apparatus including a flat head unit, in accordance with some embodiments.

FIG. 2 is a cross-sectional view of an apparatus 200, in accordance with some embodiments. The apparatus 200 includes an alignment shaft 210 and a flat head unit ("unit)" integrated into, or mated with, the alignment shaft 210. For example, the alignment shaft 210 can be an idle vision shaft of a vision system. The unit 220 includes a protruding body ("body") 222, a case 224, and a station 226.

As will be described in further detail herein, the body 222 includes a tapered region and a cylindrical region. The tapered region includes a first end having a first diameter coupled to the case 224 and includes a second end having a second diameter opposite the first end. The second diameter is less than the first diameter, and the tapered region is coupled to the cylindrical region at the second end.

As will be described in further detail herein, the case 224 houses a number of components including an upper receiving plate in contact with the station, a lower receiving plate disposed underneath the upper receiving plate, a flat head unit movement support mechanism disposed between the lower receiving plate and the body, and a centering component.

In this illustrative embodiment, the case 224 is a circular case and the station 226 has a circular flat head. The station 226 can have substantially free movement (e.g., X-Y movement) around the center by virtue of components formed within the case 224, as will be described in further detail below with reference to FIGS. 4A-4B. As further shown, one end of a mask frame 230 is placed on the station 226. The apparatus 200 can include one or more other units (not shown) to support the mask frame 230. Further details regarding the unit will now be described below with reference to FIGS. 3 and 4.

Figure 3:
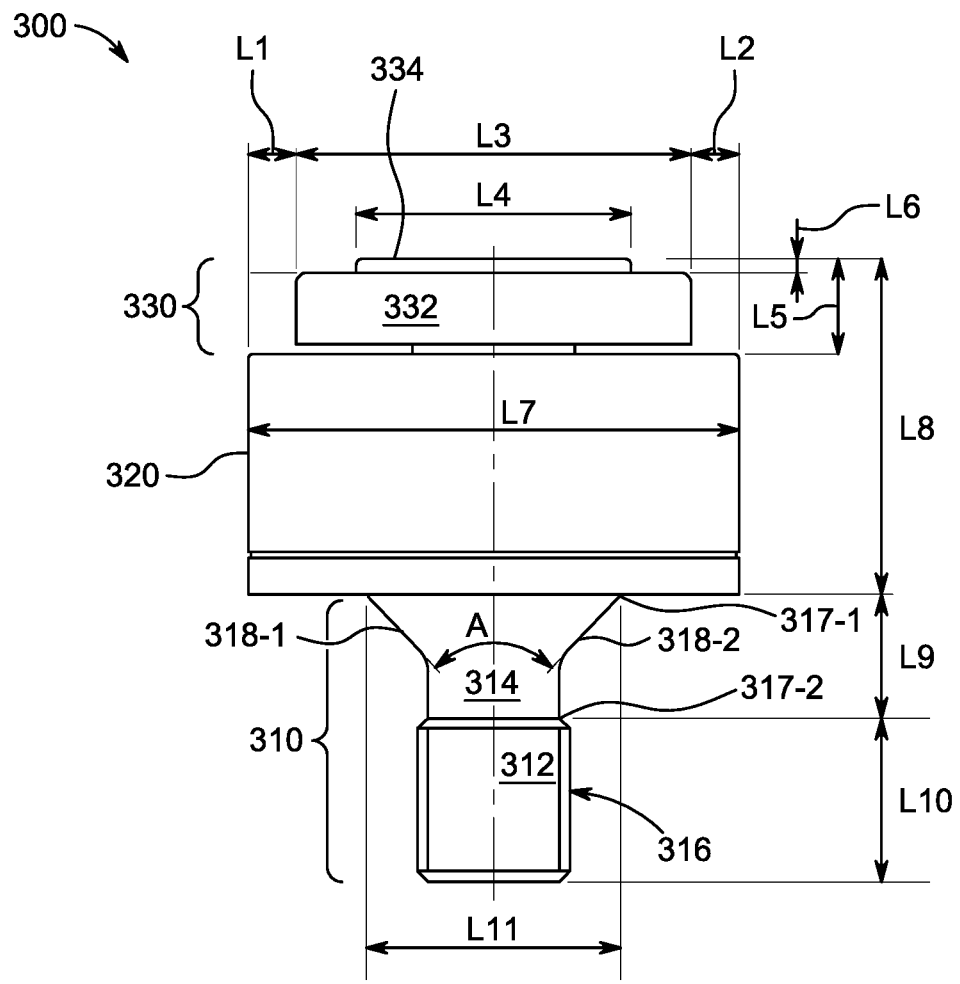
FIG. 3 is a schematic diagram of a flat head unit, in accordance with some embodiments.

FIG. 3 is a schematic diagram showing dimensions of a flat head unit ("unit) 300, in accordance with some embodiments. As shown, the unit 300 includes a protruding body ("body") 310, a case 320, and a station 330 having a lower portion 332 and an upper portion 334. The body 310 can be integrated within, or mated to, an opening within a shaft including a hollow cylinder. In some embodiments, the shaft is an alignment shaft of a vision system for mask frame alignment.

More specifically, the body 310 can include a cylindrical region 312 and a tapered region 314. The tapered region 314 includes a first end 317-1 having a first diameter coupled to the case 320 and includes a second end 317-2 having a second diameter opposite the first end. The second diameter is less than the first diameter. The tapered region 314 is coupled to the cylindrical region 312 at the second end 317-2.

The station 330 can be a moveable station with substantially free movement around the center. In this illustrative embodiment, the case 320 is a circular case and the station 330 has a circular flat head.

A distance from the left outside edge of the lower portion 332 to the left outside edge of the case 320, "L1", can be, e.g., between about 7 millimeters (mm) and about 8 mm. More specifically, L1 can be, e.g., about 7.5 mm.

Similarly, a distance from the right outside edge of the lower portion 332 to the right outside edge of the case 320, "L2", can be, e.g., between about 7 mm and about 8 mm. More specifically, L2 can be, e.g., about 7.5 mm.

A distance between the left and right outside edges of the lower portion 332, "L3" (which also corresponds to a length of the lower portion 332 and a length of the station 330), can be, e.g., between about 52 mm and about 60 mm. More specifically, L3 can be, e.g., about 56 mm.

A length of the upper portion 334, "L4", can be, e.g., between about 35 mm and about 45 mm. More specifically, L4 can be, e.g., about 39 mm.

A height of the station 330, "L5", can be, e.g., between about 10 mm and about 16 mm. More specifically, L5 can be, e.g., about 13 mm.

A height of the upper portion 334, "L6", can be, e.g., between about 0.5 mm and about 4 mm. More specifically, L6 can be, e.g., about 2 mm. Accordingly, the height of the lower portion 332 (L5-L6) can be, e.g., between about 9.5 mm and about 12 mm, and more specifically, e.g., about 11 mm.

A length of the case 320, "L7", can be, e.g., between about 65 mm and about 75 mm. More specifically, L7 can be, e.g., about 70 mm.

A combined height of the case 320 and the station 330, "L8", can be, e.g., between about 44 mm and about 52 mm. More specifically, L8 can be, e.g., about 47.75 mm. Accordingly, the height of the case 320 (L8–L5) can be, e.g., between about 34 mm and about 36 mm, and more specifically, e.g., about 34.75 mm.

A height of the tapered region 314, "L9", can be, e.g., between about 12 mm and about 22 mm. More specifically, L9 can be, e.g., about 17.1 mm.

A height of the cylindrical region 312, "L10", can be, e.g., between about 18 mm and about 28 mm. More specifically, L10 can be, e.g., about 23 mm. Thus, a height of the body 310 (L9+L10) can be, e.g., between about 30 mm and about 50 mm, and more specifically, e.g., about 40.1 mm. Accordingly, a total height of the unit 300 (L8+L9+L10) can be, e.g., between about 74 mm and about 102 mm, and more specifically, e.g., about 87.85 mm.

As further shown, the cylindrical region 312 includes a plurality of edges including edge 316. For example, the dimensions of the edge 316 can include a length of, e.g., between about 17 mm and about 27 mm, and a width of, e.g., between about 1 mm and about 4 mm. More specifically, the dimensions of the edge 316 can include a length of, e.g., about 22 mm and a width of, e.g., about 2.5 mm.

As further shown, the tapered region 314 includes a first upper edge 318-1 and a second upper edge 318-2. An angle between the first upper edge 318-1 and the second upper edge 318-2, "A", can be, e.g., between about 80° and about 100°. More specifically, A can be, e.g., about 90°.

A length of the body 310 measured between the contact point of the first upper edge 318-1 to the case 320 and the contact point of the second upper edge 318-2 to the case 320, "L11", can be, e.g., between about 31.2 mm and about 41.2 mm. More specifically, L11 can be, e.g., about 36.2 mm.

Figure 4A:
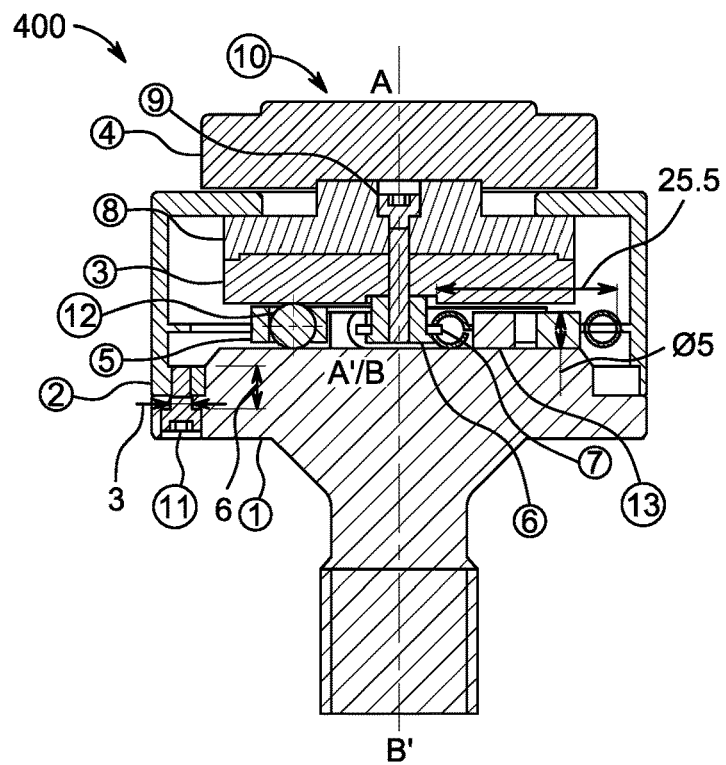
FIG. 4A is a cross-sectional view of a flat head unit, in accordance with some embodiments.

FIG. 4A is a cross-sectional view of a flat head unit ("unit") 400, in accordance with some embodiments. In this illustrative example, the unit 400 is embodied as a flat head ball (FHB) unit, in which the flat head unit movement support mechanism includes a set of balls. However, such embodiments should not be considered limiting.

As shown, the unit 400 includes a protruding body ("body") 1, a case 2 and a station 4. As will be described in further detail below, the station 4 has a flat head with substantially free movement around the center (e.g., X-Y movement). In this illustrative embodiment, the case 2 is a circular case and the station 4 has a circular flat head. The body 1 can be integrated within, or mated to, an opening within a shaft including a hollow cylinder. In some embodiments, the shaft is an alignment shaft of a vision system for mask frame alignment.

The case 2 houses a number of components. For example, the case 2 houses a lower receiving plate 3, a station 4, a ball retainer 5, a center structure 6, a spring loaded flange 7, an upper receiving plate 8, a first screw 9, a number of second screws including screw 10 (not visible in the cross-section), a number of third screws including screw 11, a number of balls including ball 12 and a number of tension springs including tension spring 13. More specifically, the second screws can include 2 screws, the third screws can include 3 screws, the balls can include 9 balls, and the tension springs can include 3 tension springs.

The station 4 is mounted into the upper receiving plate 8 and the lower receiving plate 3 with the second screws including screw 10. The lower receiving plate 3 can sit inside a pocket within the upper receiving plate during assembly. The first screw 9 is inserted through the plates 3 and 8 and the center structure 6 to secure the plates 3 and 8 within the unit 400.

The balls are used to support the load of the mask placed on the unit 400 and support movement of the unit 400, and the ball retainer 5 is used to assure the location of the each of the balls in all situations. The spacing of the balls provides an approximately even distribution of a load placed on the unit 400. More specifically, as will be described in further detail below with reference to FIGS. 5A-5H, the respective sets of the balls are placed on the body 1 in respective regions between respective ones of the tension springs. For example, if the balls include 9 balls and the tension springs includes 3 springs, a first set of 3 balls can be placed in a first region (e.g., sector) defined between a first tension spring and a second tension spring, a second set of 3 balls can be placed in a second region defined between the second tension spring and a third tension spring, and a third set of 3 balls can be placed in a third region defined between the third tension spring and the first tension spring. Accordingly, in this illustrative embodiment, the unit 400 is a flat head ball (FHB) unit, in which the flat head unit movement support mechanism includes a set of balls.

The tension springs are part of a centering component or centering mechanism that brings the station 4 back to the center when there is no load on the unit 400, as shown in FIG. 4A. For example, as will be described in further detail below with reference to FIGS. 5A-5H, each of the tension springs can have one end attached to the a centering ring of the center structure 6 using the spring loaded flange 7 and another end attached to the case 2. For example, if there are 3 tension springs, each of the 3 tension springs can be placed at about a 120° angle relative to each other. Further details regarding the configuration of the tension springs within the unit 400 will be described below with reference to FIGS. 5A-5H.

In this illustrative embodiment, the centering component is implemented using tension springs. However such an embodiment should not be considered limiting. For example, a magnetic-based mechanism can be used instead of the tension springs to bring the station 4 back to the center when there is no load on the unit 400.

The case 2 is connected to the body 1 using the plurality of third screws including screw 11. The body 1 can have a suitable thread feature for easy replacement of another mask frame support unit (e.g., BTU) with the unit 400.

The components of the unit 400 can be formed from any suitable material(s) in accordance with the embodiments described herein. For example, the components 1, 3 and 4 can illustratively be formed from a suitable ceramic material. In some embodiments, the ceramic material can be aluminum oxide or alumina ($Al_2O_3$). However, such embodiments should not be considered limiting.

The components 2 and 5-11 can be formed from an alloy or other suitable material. In some embodiments, the alloy is an aluminum (Al) alloy. For example, the Al alloy can be a 6061 Al alloy (e.g., a 6061-T6 Al alloy).

The plurality of balls, including ball 12, can be formed from any suitable material in accordance with the embodiments described herein. For example, the plurality of balls can be formed from a ceramic material. In some embodiments, the plurality of balls can be formed from zirconium dioxide or zirconia ($ZrO_2$). Each of the plurality of balls can have a diameter of, e.g., between about 4 mm and about 8.5 mm. More specifically, each of the plurality of balls can have a diameter of, e.g., about 6.35 mm (or 0.25 inch). Further details regarding the configuration of the plurality of balls will be described below with reference to FIGS. 5A-5H.

The plurality of tension springs can be formed from a suitable material (e.g., alloy) that has excellent mechanical strength, particularly at high temperatures, and is highly resistant to corrosive and/or oxidative effects. In some embodiments, the plurality of tension springs can be formed from a suitable nickel alloy. One example of a suitable nickel alloy is a nickel-molybdenum alloy. For example, the plurality of tension springs can be formed from a suitable nickel-molybdenum-chromium alloy. Such a nickel-molybdenum-chromium alloy can include a small amount of tungsten to provide additional corrosion-resistant properties.

The first screw 9, the second screws including screw 10, and the third screws including screw 11 can each have any suitable dimensions in accordance with the embodiments described herein. For example, the first screw 9 can have a diameter of, e.g., between about 2.5 mm and about 3.5 mm and a length of, e.g., between about 16 mm and about 20 mm (e.g., an M3×18 mm screw), the second screw 10 can have a diameter of, e.g., between about 3.5 mm and about 4.5 mm and a length of, e.g., between about 13 mm and about 17 mm (e.g., an M4×15 mm screw), and the third screw 11 can have a diameter of, e.g., between about 2.5 mm and about 3.5 mm and a length of, e.g., between about 4 mm and about 8 mm (e.g., an M3×6 mm screw).

The first screw 9, the second screws including screw 10, and the third screws including screw 11 can be formed from any suitable material in accordance with the embodiments described herein. One example of a suitable material is anodized Al. However, other similarly suitable materials are contemplated.

In FIG. 4A, the unit 400 is in a neutral position in which a center position of the station 4, the lower receiving plate 3, the upper receiving plate 8, etc., denoted by line A-A', is collinear with a center position of the body 1, denoted by line B-B'. However, as will be described below with reference to FIG. 4B, line A-A' can move in a direction away from the center position (e.g., in any X-Y direction) in response to a load placed on the unit 400.

Figure 4B:
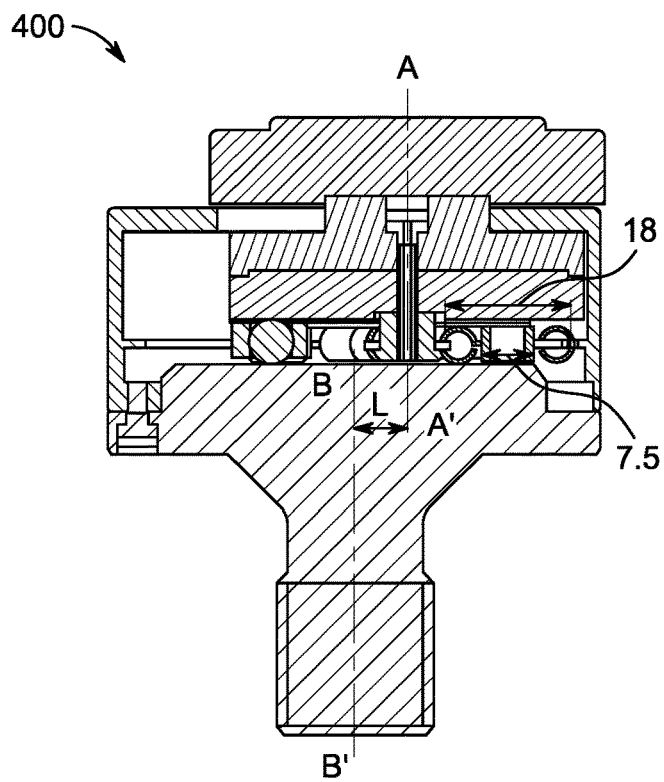
FIG. 4B is a cross-sectional view of the flat head unit of FIG. 4A after movement from a neutral position to an offset position, in accordance with some embodiments.

FIG. 4B is another cross-sectional view of the unit 400 after a movement from the neutral position shown in FIG. 4A to an offset position. More particularly, in this illustrative example, the line A-A' has moved to the right relative to the line B-B' by at most a maximum distance "L." In other embodiments, the line A-A' can move to the left relative to the line B-B' by at most the maximum distance L. In other embodiments, the line A-A' can move "forward" or "backward" relative to the line B-B' (e.g., into the page or out of the page) by at most the maximum distance L. Accordingly, the line A-A' can move away from line B-B' in any suitable X-Y direction by a distance of at most L. Upon removal of the load on the unit 400, the centering component including the plurality of tension springs can revert the unit 400 from the offset position shown in FIG. 4B back to the neutral position shown in FIG. 4A. That is, the centering component can automatically realign line A-A' with line B-B'.

The maximum distance L is defined by the dimensions of the unit 400, as described in further detail above with reference to FIG. 3. For example, in some embodiments, the maximum distance L is, e.g., about 7.5 mm from the center position, such that the unit 400 can move up to about 7.5 mm from the center position in any X-Y direction.

FIGS. 5A-5H depict a process flow of fabricating a flat head unit 500, in accordance with some embodiments. The flat head unit 500 can be a mask frame support unit for supporting a mask frame. In this illustrative embodiments, the flat head unit 500 is a flat head ball (FHB) unit. However, such embodiments should not be considered limiting.

Figure 5A:
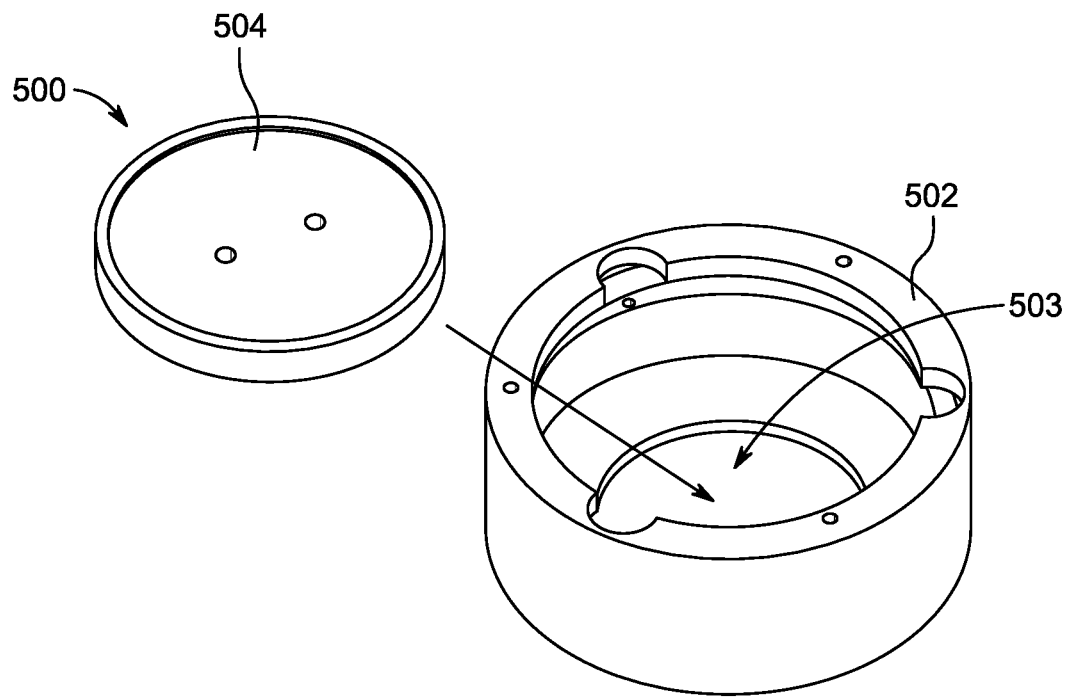
FIGS. 5A-5H illustrate an example process flow of forming a flat head unit, in accordance with some embodiments.

FIG. 5A shows a bottom view of the flat head unit 500 including a case 502. An upper receiving plate 504 will be inserted within the region 503 defined within the top of the case 502. The case 502 and the upper receiving plate 504 are similar to the cases and upper receiving plates described above with reference to FIGS. 4A-4B.

Figure 5B:
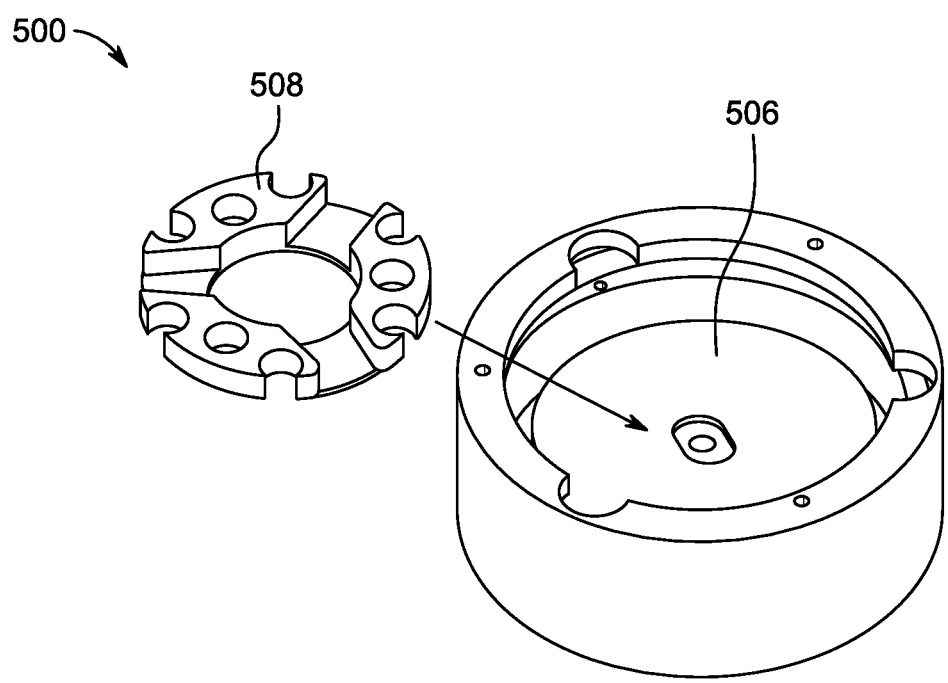

FIG. 5B shows the insertion of the upper receiving plate 504, the insertion of a lower receiving plate 506 on the upper receiving plate 504, and a ball retainer 508 that will be placed on the lower receiving plate 506. The lower receiving plate 506 and the ball retainer 508 are similar to the lower receiving plate and the ball retainer described above with reference to FIGS. 4A-4B.

Figure 5C:
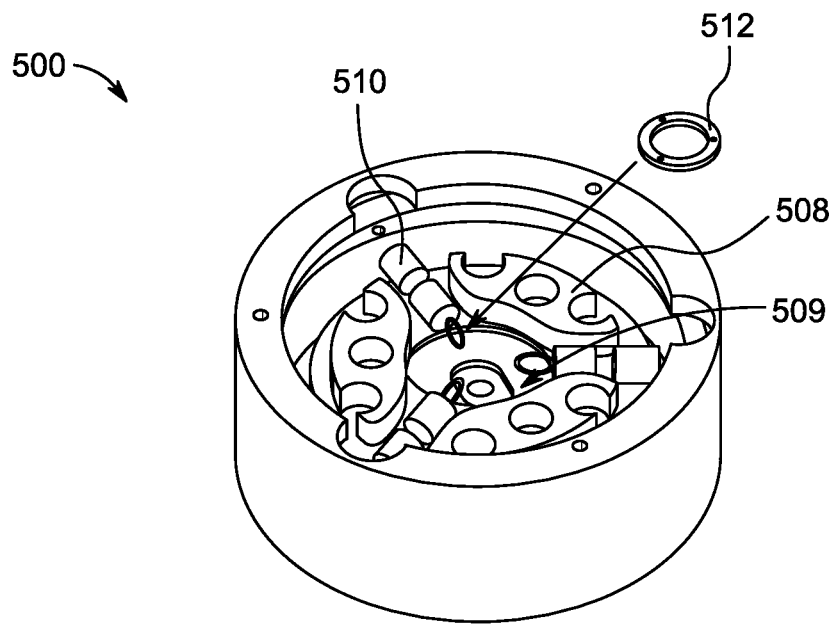

FIG. 5C shows the placement of the ball retainer 508 on the upper receiving plate 506, the placement of a set of tension springs including tension spring 510 between respective gaps of the baller retainer 508, and a centering ring 512 to be placed in the region 509 defined by the ball retainer 508. The set of tension springs including tension spring 510 and the centering ring 512 are similar to the set of tension springs and the centering ring described above with reference to FIGS. 4A-4B.

Figure 5D:
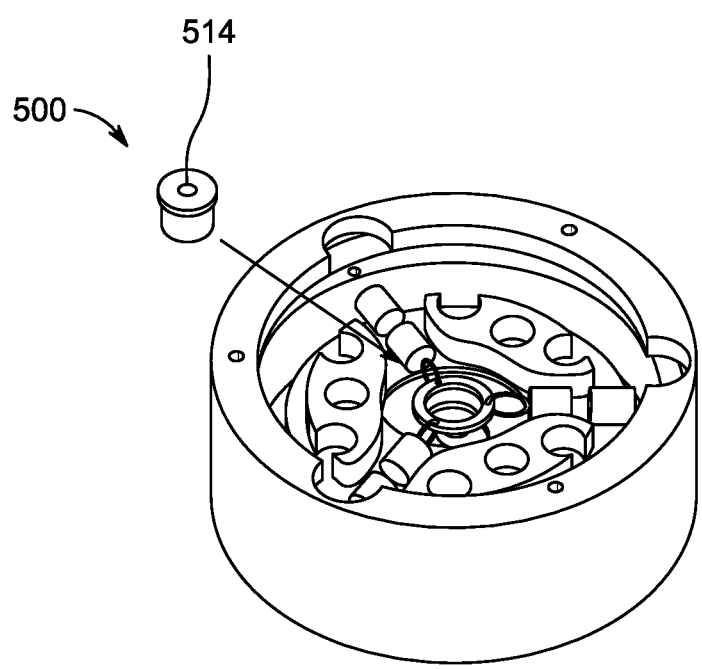

FIG. 5D shows the attachment of the centering ring 512 to each tension spring of the set of tension springs within the region 509, and a center pin 514 to be placed within the centering ring 512 to form a centering component or mechanism. The centering component is similar to the centering component described above with reference to FIGS. 4A-4B.

Figure 5E:
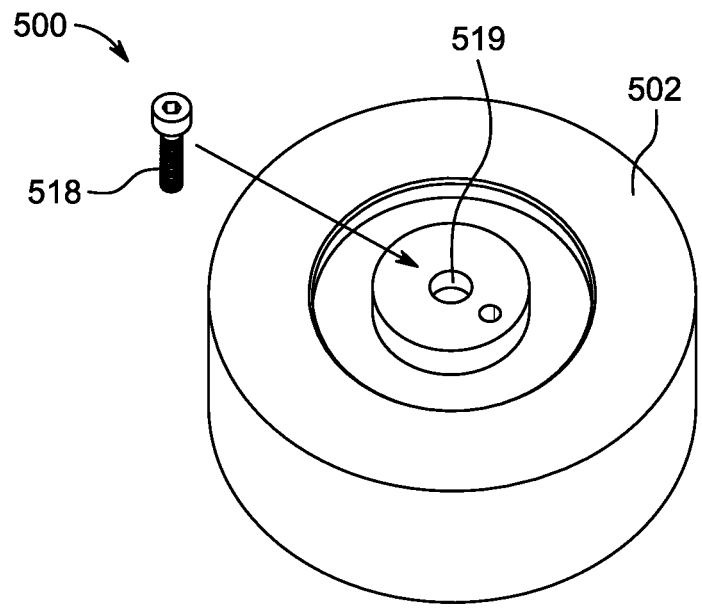

FIG. 5E depicts a top view of the flat head unit 500, which shows a bolt or screw 518 that will be placed through a hole 519 disposed within a top of the case 502 to secure the center pin 514. The screw 518 is similar to the first screw described above with reference to FIGS. 4A-4B.

Figure 5F:
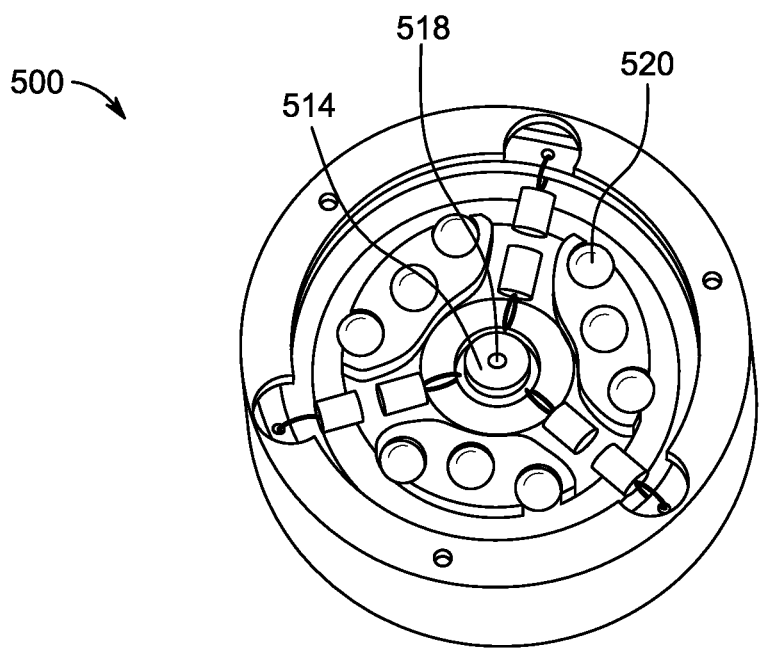

FIG. 5F reverts back to a bottom view of the flat head unit 500, which shows a set of balls including ball 520 each inserted within a respective location of the ball retainer 508. In this illustrative embodiment, the set of balls includes 9 balls. As further shown, the end of the screw 518 can be visible and flush with respect to the center pin 514. The set of balls including ball 520 is similar to the set of balls described above with reference to FIGS. 4A-4B.

Figure 5G:
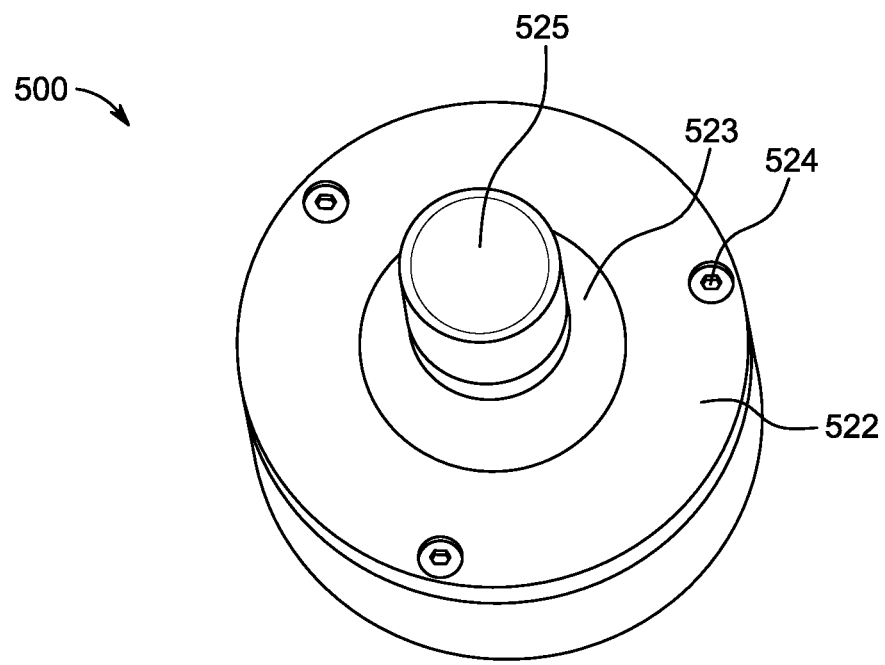

FIG. 5G shows a protruding body ("body") 522 secured to the bottom of the case 502 via a plurality of bolts or screws including bolt or screw 524. The body 522 and the plurality of bolts or screws including bolt or screw 524 are similar to the body and the plurality of third screws, respectively, described above with reference to FIGS. 4A-4B. As shown, the body 522 includes a tapered region 523 and a cylindrical region 525.

Figure 5H:
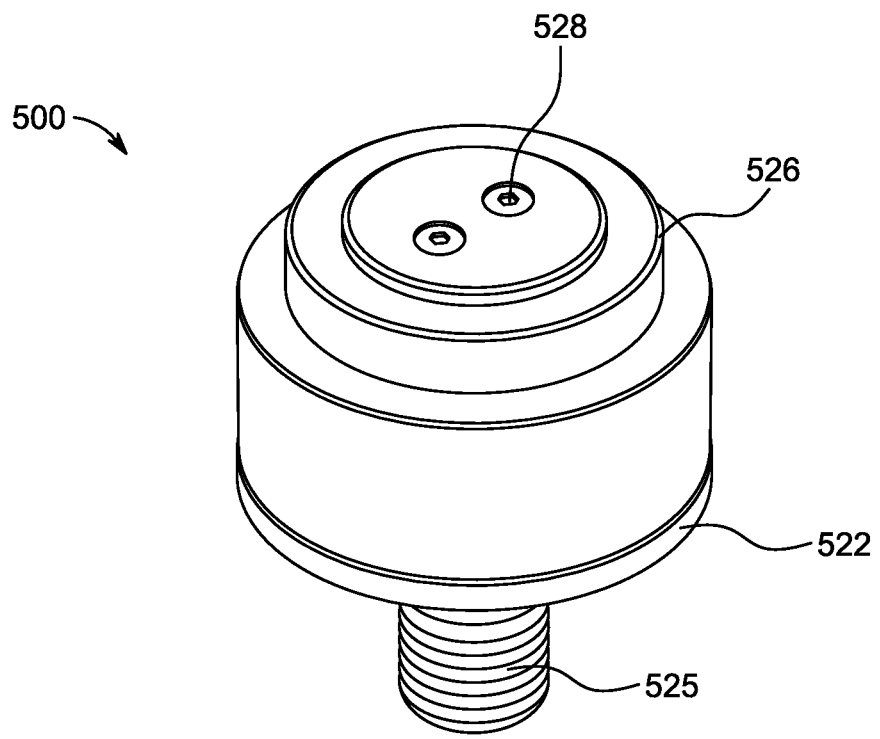

FIG. 5H depicts a top view of the flat head unit 500, which shows a station 526 secured to the top of the case 502 with screws including a screw 528. The station 526 is similar to the station and the screws including screw 528 are similar to the plurality of second screws, respectively, described above with reference to FIGS. 4A-4B.

The body 522 can be integrated into, or mated with, an opening within a hollow cylinder. In some embodiments, the hollow cylinder is an alignment shaft of a vision system for mask frame alignment. In this illustrative embodiment, cylindrical region 525 is designed with threads, such that the body 522 can be integrated into the hollow cylinder using a threaded locking mechanism (e.g., "screwed into" the hollow cylinder). However, any suitable integration mechanism can be used to integrate the body 522 within the hollow cylinder in accordance with the embodiments described herein.

Figure 6:
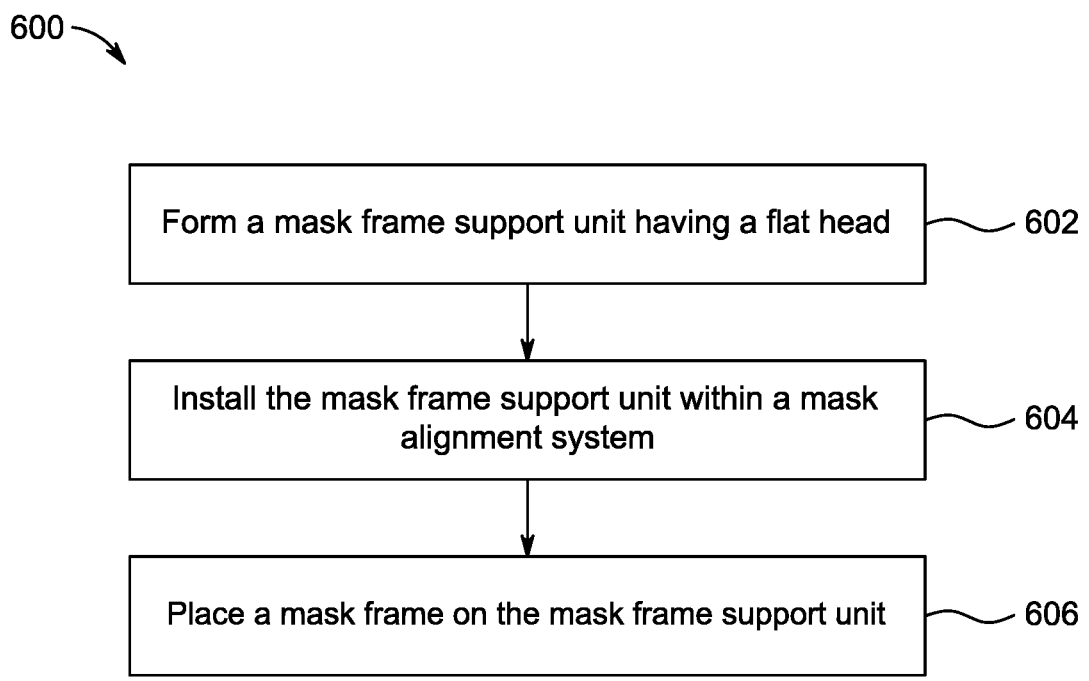
FIG. 6 is a flow chart of a method for forming an apparatus including a flat head unit, in accordance with some embodiments.

FIG. 6 depicts a flow diagram of a method 600 of integrating a mask frame support unit within a mask alignment system, in accordance with some embodiments. For example, the unit assembly can be similar to the unit described above with reference to FIGS. 2-5.

At block 602, a mask frame support unit having a flat head is formed. In some embodiments, the mask frame support unit is a flat head ball (FHB) unit. For example, the mask frame support unit can be formed in accordance with the process flow described above with reference to FIGS. 5A-5H.

At block 604, the mask frame support unit is installed within a mask alignment system. Installing the mask frame support unit can include integrating a protruding body of the mask frame support unit into an opening of an alignment shaft including a hollow cylinder. More specifically, the alignment shaft can be an idle vision shaft.

At block 606, a mask frame is placed on the mask frame support unit. The mask frame support unit can support the weight of the mask frame while reducing or eliminating dents or other deformations. The mask frame support unit can also include a centering component or mechanism to enable movement of the mask frame. For example, upon removal of the mask, centering component can cause the flat head unit to re-center itself.

Further details regarding the method 600, including the flat head unit and the mask frame, are described above with reference to FIGS. 1-5.

Figure 7A:
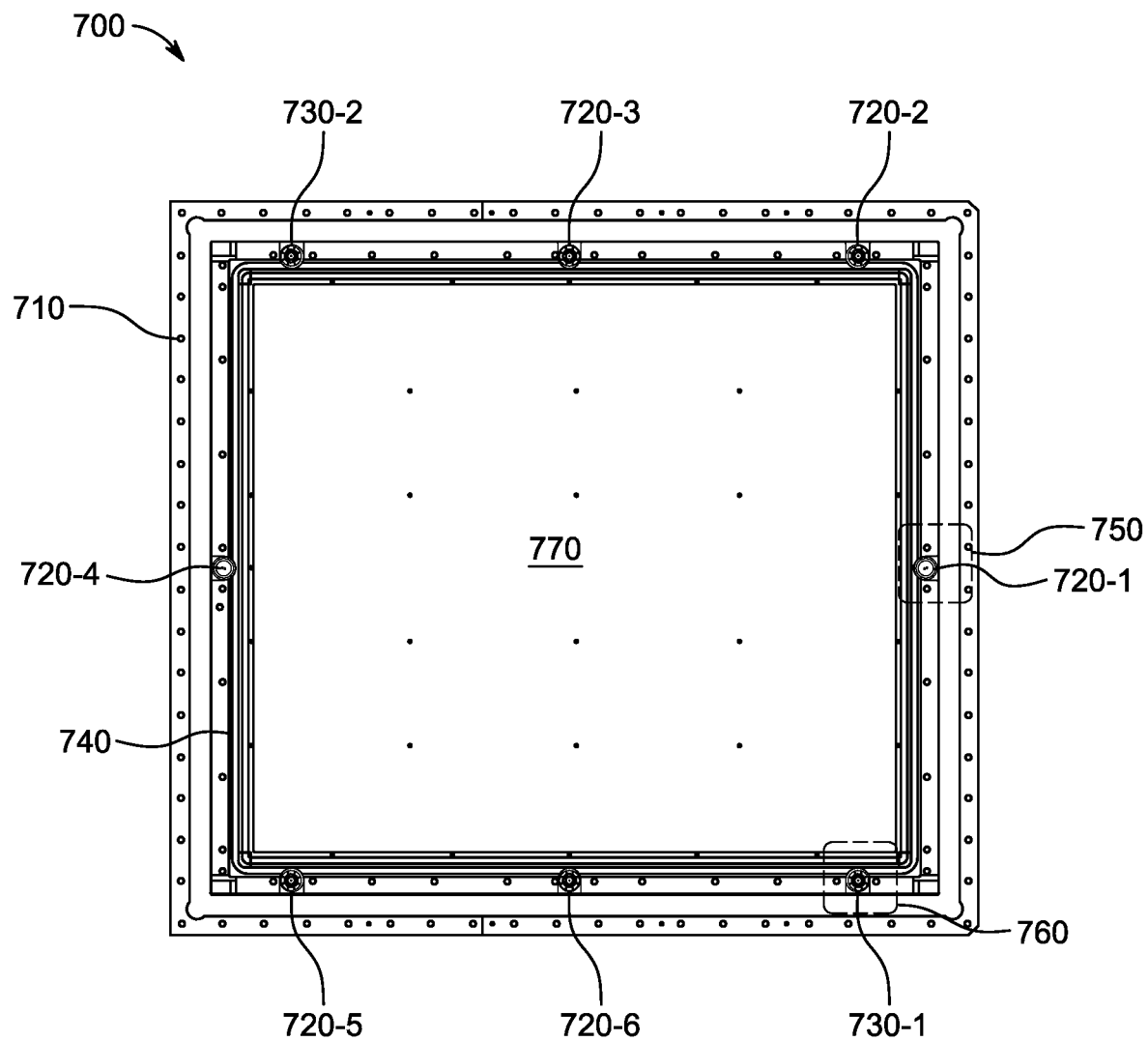
FIGS. 7A-7C are top-down views of a mask alignment system, in accordance with some embodiments.
Figure 7B:
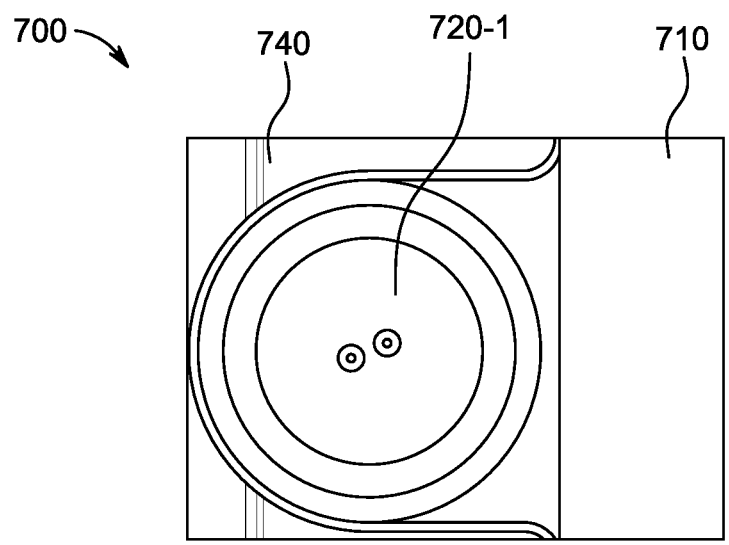
Figure 7C:
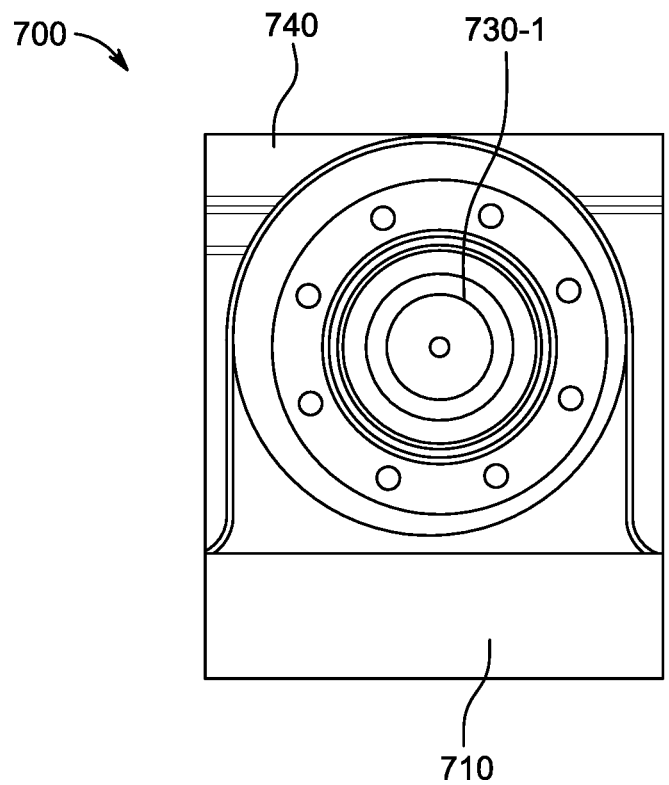

FIGS. 7A-7C are top-down views of a mask alignment system 700, in accordance with some embodiments. For example, the 700 can include a vision system.

FIG. 7A shows an overview of the system 700. As shown, the system 700 includes a chamber body 710, a plurality of flat head units 720-1 through 720-6, a plurality of ball transfer units (BTUs) 730-1 and 730-2, and a mask frame 740 placed on the plurality of flat head units 720-1 through 720-6 and the plurality of BTUs 730-1 and 730-2. Although 6 flat head units and 2 BTUs are shown, any suitable number of flat head units and/or BTUs can be used in accordance with the embodiments described herein. In some embodiments, the plurality of flat head units 720-1 through 720-6 include flat head ball (FHB) units. A region 750 corresponding to the flat head unit 720-1 and a region 760 corresponding to the BTU 730-1 are also depicted. A patterned mask sheet can be used to cover an area of a substrate during, e.g., a coating process.

FIG. 7B shows a blown-up view of the system 700 corresponding to region 750 shown in FIG. 7A. FIG. 7C shows a blown-up view of the system 700 corresponding to region 760 shown in FIG. 7B.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other implementation examples will be apparent to those of skill in the art upon reading and understanding the above description. Although the present disclosure describes specific examples, it will be recognized that the systems and methods of the present disclosure are not limited to the examples described herein, but may be practiced with modifications within the scope of the appended claims. Accordingly, the specification and drawings are to be regarded in an illustrative sense rather than a restrictive sense. The scope of the present disclosure should, therefore, be determined with reference to the appended claims, along with the full scope of equivalents to which such claims are entitled.

What is claimed is:

1. A mask frame support unit comprising:
a case;
a protruding body extending below the case, the protruding body comprising a tapered region and a cylindrical region, the tapered region comprising a first end having a first diameter coupled to the case and comprising a second end having a second diameter opposite the first end of the tapered region, wherein the second diameter is less than the first diameter, and wherein the tapered region is coupled to the cylindrical region at the second end of the tapered region; and
a station having a flat head disposed above the case;
wherein the case houses a plurality of components comprising:
an upper receiving plate in contact with the station;
a lower receiving plate disposed underneath the upper receiving plate;
a flat head unit movement support mechanism disposed between the lower receiving plate and the protruding body; and
a centering component.

2. The mask frame support unit of claim 1, wherein the flat head unit movement support mechanism comprises a set of balls disposed in a ball retainer.

3. The mask frame support unit of claim 1, wherein the centering component comprises a set of tension springs each having a first end attached to the case and a second end attached to a centering ring.

4. The mask frame support unit of claim 1, wherein the case is a circular case and the flat head is a circular flat head.

5. The mask frame support unit of claim 1, wherein the centering component, in response to removal of a load disposed on the station, is to center the station to a neutral position.

6. The mask frame support unit of claim 1, wherein:
the protruding body has a height between about 30 mm and about 50 mm and a length between about 31.2 mm and about 41.2 mm;
the case has a height between about 34 mm and about 36 mm and a length between about 65 mm and about 75 mm; and
the station has a height between about 10 mm and about 16 mm and a length between about 52 mm and about 60 mm.

7. The mask frame support unit of claim 6, wherein:
the protruding body has a height of about 40.1 mm and a length of about 36.2 mm;
the case has a height of about 34.75 mm and a length of about 70 mm; and
the station has a height of about 13 mm and a length of about 56 mm.

8. A system comprising:
a mask frame;
an alignment shaft comprising a hollow cylinder having an opening; and
a plurality of mask frame support units comprising a flat head unit, the flat head unit comprising:
a case;
a protruding body extending below the case and integrated into the alignment shaft via the opening; and
a station having a flat head disposed above the case;
wherein the case houses a plurality of components comprising:
an upper receiving plate in contact with the station;
a lower receiving plate disposed underneath the upper receiving plate;
a flat head unit movement support mechanism disposed between the lower receiving plate and the protruding body; and
a centering component.

9. The system of claim 8, wherein the flat head unit movement support mechanism comprises a set of balls disposed in a ball retainer.

10. The system of claim 8, wherein the centering component comprises a set of tension springs each having a first end attached to the case and a second end attached to a centering ring.

11. The system of claim 8, wherein the case is a circular case and the flat head is a circular flat head.

12. The system of claim 8, wherein the plurality of mask frame support units comprises six flat head unit movement support mechanisms and two ball transfer units.

13. The system of claim 8, wherein the centering component, in response to removal of the mask frame from the station, is to center the station to a neutral position.

14. The system of claim 8, wherein:
the protruding body has a height between about 30 mm and about 50 mm and a length between about 31.2 mm and about 41.2 mm;
the case has a height between about 34 mm and about 36 mm and a length between about 65 mm and about 75 mm; and
the station has a height between about 10 mm and about 16 mm and a length between about 52 mm and about 60 mm.

15. The system of claim 8, wherein: the protruding body comprises a tapered region and a cylindrical region; the tapered region comprises a first end having a first diameter coupled to the case and comprises a second end having a second diameter opposite the first end of the tapered region; the second diameter is less than the first diameter; and the tapered region is coupled to the cylindrical region at the second end of the tapered region.

16. A method of forming a mask frame support unit comprising:
inserting an upper receiving plate and a lower receiving plate within a case;
forming a centering component within the case;
securing a protruding body to a bottom of the case, the protruding body comprising a tapered region and a cylindrical region, the tapered region comprising a first end having a first diameter coupled to the case and comprising a second end having a second diameter opposite the first end of the tapered region, wherein the second diameter is less than the first diameter, and wherein the tapered region is coupled to the cylindrical region at the second end of the tapered region; and
securing a station having a flat head to a top of the case.

17. The method of claim 16, wherein forming the centering component comprises:
placing a set of tension springs on the lower receiving plate; and
attaching the set of tension springs to a centering ring.

18. The method of claim 17, further comprising:
placing a ball retainer comprising a plurality of ball locations on the upper receiving plate, wherein each tension spring of the set of tension springs is disposed between a respective gap of the ball retainer; and inserting a ball within each of the plurality of balls locations.

19. The method of claim 17, further comprising forming a center pin within the centering ring.

20. The method of claim 16, further comprising installing a flat head unit within a mask alignment system including a mask frame, wherein installing the flat head unit comprises integrating the protruding body into an alignment shaft.

* * * * *